April 20, 1971 F. P. CHIOVAROU ET AL 3,575,743

METHOD OF MAKING A PHOSPHORUS GLASS PASSIVATED TRANSISTOR

Filed June 5, 1969 2 Sheets-Sheet 1

INVENTORS
Frank Peter Chiovarou and
Adolph Paul Storz.

BY [signature]

ATTORNEY

April 20, 1971 F. P. CHIOVAROU ET AL 3,575,743

METHOD OF MAKING A PHOSPHORUS GLASS PASSIVATED TRANSISTOR

Filed June 5, 1969 2 Sheets-Sheet 2

INVENTORS
Frank Peter Chiovarou and
Adolph Paul Storz.

BY [signature]
ATTORNEY

United States Patent Office 3,575,743

Patented Apr. 20, 1971

3,575,743

METHOD OF MAKING A PHOSPHORUS GLASS PASSIVATED TRANSISTOR

Frank Peter Chiovarou, Martinsville, and Adolph Paul Storz, Somerville, N.J., assignors to RCA Corporation Filed June 5, 1969, Ser. No. 830,806

Int. Cl. H01l 7/36

U.S. Cl. 148—187 8 Claims

ABSTRACT OF THE DISCLOSURE

Phosphosilicate glass is incorporated as a stabilizer in the passivating oxide on the surface of a diffused planar bipolar transistor by (1) driving in a base diffusion in oxygen for a time less than that required to complete the base diffusion, (2) depositing phosphosilicate glass on the oxidized surface of the transistor, (3) depositing a protective silicon dioxide coating by the pyrolysis of silane, $SiH_4$, on the phosphosilicate glass, and then (4) densifying the silicon dioxide coating in an oxygen ambient for a time sufficient to complete the base drive-in step.

BACKGROUND OF THE INVENTION

Figure 1:
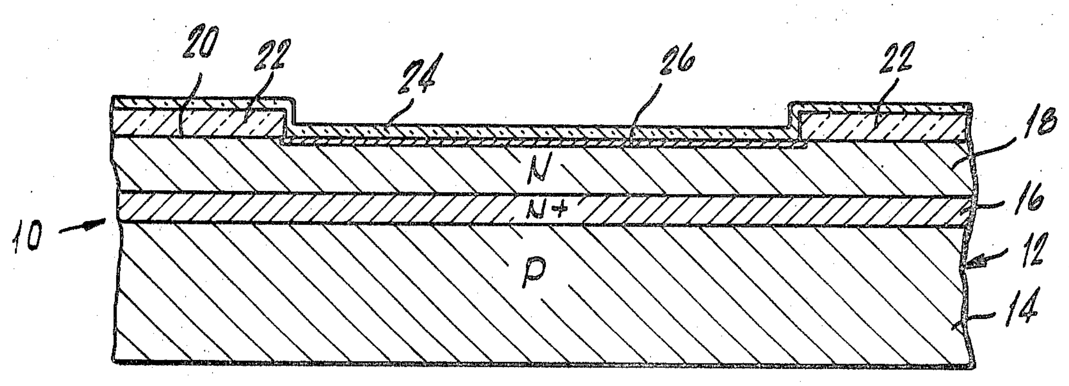
Figure 2:
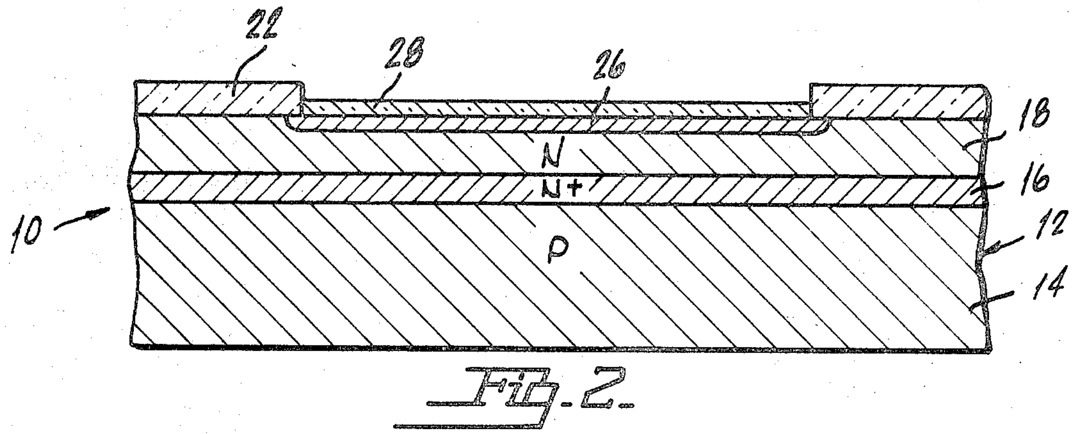

This invention relates to the manufacture of junction transistors. More particularly, the invention pertains to an improved process of making a passivated planar bipolar transistor.

Planar bipolar transistors are conventionally fabricated by a process which includes the diffusion of regions of mutually opposite type conductivity into a body of semiconductive material to form NPN or PNP structures. The sites of the diffused regions are defined by known photolithogrophic techniques. In the manufacture of silicon devices, the diffusions are usually carried out by a two step process in which the semiconductor is first heated in an ambient containing a conductivity modifying impurity and oxygen so that a shallow highly doped diffused region is formed in the device and a glassy coating is formed on the surface of the device. This coating protects the underlying semiconductor surface against evaporation or chemical reaction and also acts as an intermediate impurity source between the original impurity source and the semiconductive body. After this deposition step, the glassy coating is removed and the device is further heated, in steam, to cause redistribution of the conductivity modifying impurities from the shallow region to a desired depth and to cause reoxidation of the semiconductor surface.

In silicon transistors, phosphorus is conventionally employed as a donor impurity. The deposition of this impurity in an oxidizing ambient results in the formation of a coating of an amorphous mixture of silicon dioxide ($SiO_2$), and phosphorus pentoxide ($P_2O_5$), i.e. a phosphosilicate glass, on the surface of the silicon. It has been found that transistors which are made in such a way that the phosphosilicate glass coating which is formed during the emitter deposition is retained on the device are less sensitive to elevated temperature and biasing voltages than those which do not have such a coating. A theoretical explanation of the effect of a phosphosilicate layer on a bipolar transistor is given by Kerr et al., Stabilization of $SiO_2$ Passivation Layers With $P_2O_5$, IBM Journal of Research and Development, September 1964, at pages 376 to 384.

The results obtained in prior devices formed in the manner taught by Kerr et al. have been unpredictable. The degree of passivation is apparently related to the thickness of the phosphosilicate glass layer and this is difficult to control, because the glass layer is affected by an etching treatment used just prior to the deposition of the contact metallization to lower the contact resistance. This treatment removes some or all of the phosphosilicate glass.

Heretofore, phosphosilicate glass has not been included in the passivating coating on transistors which are intended to be operated at high frequencies. These transistors have been fabricated with extremely small emitter dimensions. The conventional emitter redistribution step has been omitted from the fabrication of these devices because, if the small emitter sites are re-oxidized, it is then necessary to photoetch contact openings. It is not possible to align the photomask used to define those emitter contact openings with sufficient accuracy to insure that only emitter material is exposed. Consequently, in these devices, the shallow region formed during the deposition step has been utilized as the emitter region. Accurate contact openings can be made by simply removing the phosphosilicate glass formed during the emitter deposition. Consequently, after the contact openings are formed, no phosphosilicate glass remains on the devices.

SUMMARY OF THE INVENTION

The present method provides for the fabrication of phosphosilicate glass passivated bipolar transistors which are free of the problems of the prior art. The passivating layer is a sandwich of phosphosilicate glass between an oxide layer and a protective coating. The phosphosilicate glass layer is formed on the device after the formation of the base region but before the formation of an opening over the emitter site. A protective coating is formed over the phosphorus glass coating and then the emitter opening is made and the emitter is diffused.

THE DRAWINGS

FIGS. 1 to 6 are a series of cross-sectional views illustrating the steps in the present process.

THE PREFERRED EMBODIMENT

The cross sectional structure of a partially processed wafer prior to the performance of the novel steps of the present method is shown in FIG. 1. The wafer, generally designated by the numeral 10, includes a body 12 of semiconductive material, such as silicon, which has been provided, by conventional means and processes, with a lower supporting portion 14, an intermediate N+ type portion 16 and an uper N type portion 18 of the proper resistivity to serve as a transistor collector. Conventionally, the N type portion 18 is an epitaxial layer grown on the surface of the N+ type portion 16. The body 12 has an upper surface 20 upon which the diffusion operations are performed.

The configuration illustrated in FIG. 1 exists after the impurity deposition step of the base diffusion. Prior to the deposition itself, a diffusion masking coating 22 is formed on the surface 20 of the body 12. This coating 22 which is typically of silicon dioxide, is formed in conventional manner by heating the body 12 in an oxidizing ambient in order to form a genetic oxide coating of silicon dioxide. Thereafter, a portion of the coating 22 is removed by known photoetching techniques to expose that portion of the surface 20 which is intended to be occupied by the base region of the device.

After the photoetching step has been completed, the body 12 is placed in a furnace in an atmosphere containing an acceptor impurity, typically boron, and oxygen for a time and at a temperature sufficient to produce a coating of borosilicate glass 24 on the surface 20 and over the upper surface of the coating 22. This deposition step also results in the formation of a shallow diffused region 26 of the P+ type conductivity in the layer 18 beneath the surface 20 of the body 12. All of the steps described so far are well-known in the art. The steps hereinafter described are new.

A base redistribution step is next performed but it is carried out for a time less than that required to drive the base region to its finished depth. The borosilicate glass coating 24, shown in FIG. 1, is first removed from the wafer 10 in a suitable solvent and the wafer 10, without the coating 24, is disposed in a furnace in an atmosphere of steam at a temperature, typically around 1100° C., such that further diffusion of the acceptor impurities in the region 26 takes place. At the same time, the exposed surface of the device 10 is oxidized to form a new masking oxide coating 28 (FIG. 2) and the masking oxide coating 22 increases in thickness. The reduction in redistribution time is used because later in the process, the wafer 10 will be subjected to high temperatures for substantial times and further diffusion of the region 26 will invariably take place. Consequently, in order to compensate for this further diffusion, it is desirable at this stage in the process to limit the depth of the region 26 to a value less than the final desired depth.

Figure 3:
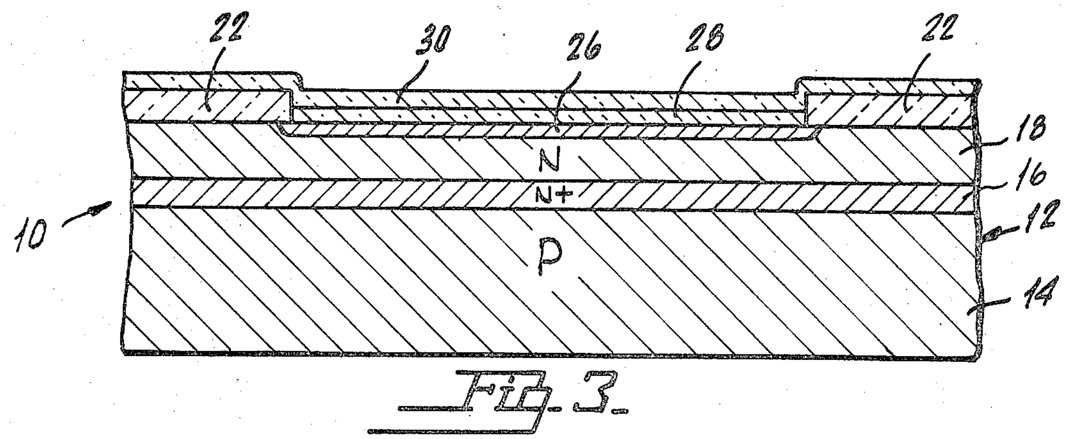

Upon completion of the partial base redistribution step, the wafer 10 is placed in a furnace in an ambient containing phosphorus and oxygen for a time and at a temperature sufficient to form a phosphosilicate glass coating 30, FIG. 3, over all of the exposed upper surface of the masking oxide coating 22 and the base oxide coating 28. For example, the wafer 10 may be heated to a temperature of between 650° C. to 950° C. in an ambient containing oxygen and phosphorus derived from bubbling nitrogen through a liquid phosphorus oxychloride bath. The time of deposition is not critical but should range from about 5 to about 30 minutes to achieve a phosphosilicate glass coating 30 ranging from 200 to 2,000 A. in thickness. As another example, the coating 30 may be produced by the pyrolysis of a mixture of silane, ($SiH_4$), and phosphene ($PH_3$), in oxygen. This process is advantageous in that it can be carried out at a relatively low temperature of about 300° C. and the depth of the region 26 is not appreciably affected thereby.

Figure 4:
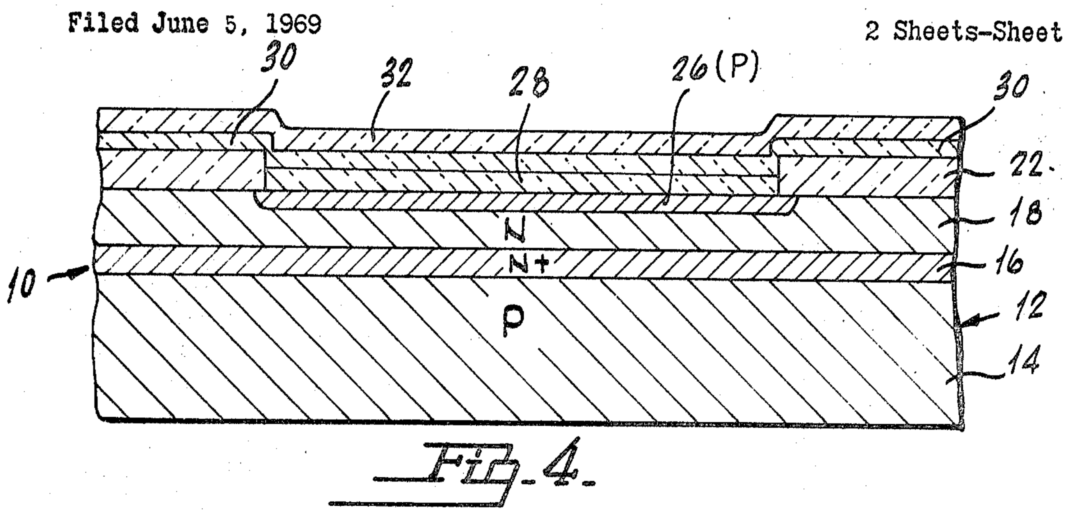

The next step in the process, illustrated in FIG. 4, is to provide a protective coating 32 over the phosphosilicate glass coating 30. This step is preferably carried out by heating the wafer 10 in an atmosphere of silane, $SiH_4$, and oxygen for a time and at a temperature sufficient to form a coating 32 of silicon dioxide about 2000 A. in thickness. A silicon dioxide coating made by this process has a relatively low density and it is preferable to anneal it in an oxidizing atmosphere. Accordingly, the next step in the present process is to heat the wafer 10 in steam, for example, for a time sufficient to increase the density of the coating 32 to a desired value. This step also results in completing the redistribution of impurities in the region 26 to a depth to which they would otherwise have been diffused in a prior art process which did not employ the step of depositing the phosphosilicate glass coating.

Figure 5:
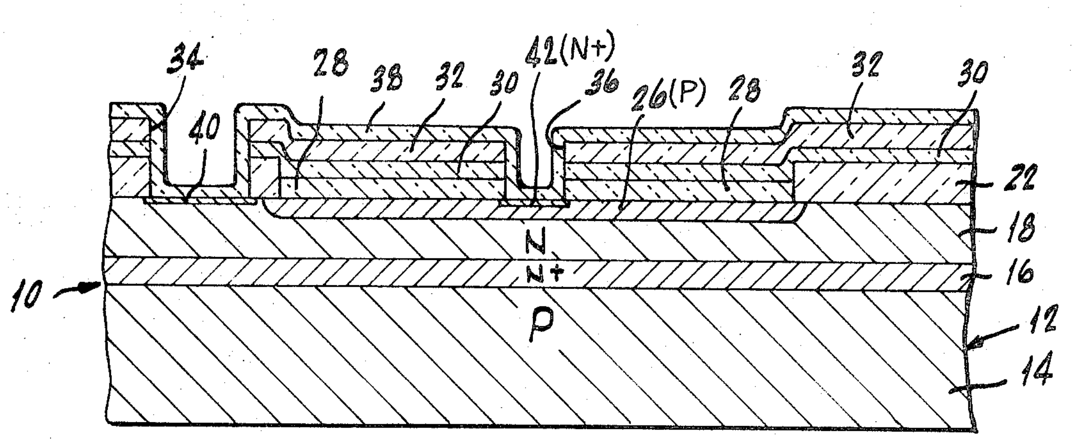

From this point on, the processing may follow the procedures conventionally employed in the manufacture of high frequency bipolar transistors with non-reoxidized emitters. Thus, as illustrated in FIG. 5, openings as indicated generally at 34 and 36 may be provided by known photolithographic techniques through the protective coating 32, the phosphosilicate glass coating 30 and the masking oxide coatings 22 and 28 to expose material of the region 18, which will be the collector region of the device and a portion of the surface adjacent to the base region 26, the emitter site. Thereafter, the wafer 10 is placed in the phosphorus deposition furnace again for a time and at a temperature sufficient to form a phosphosilicate glass coating 38 over all of the exposed surfaces of the wafer 10. This deposition also results in the formation of a highly doped N++ region 40 which serves to aid in making ohmic contact to the collector region 18 and a highly doped N+ type region 42 which constitutes the emitter of the device.

Figure 6:
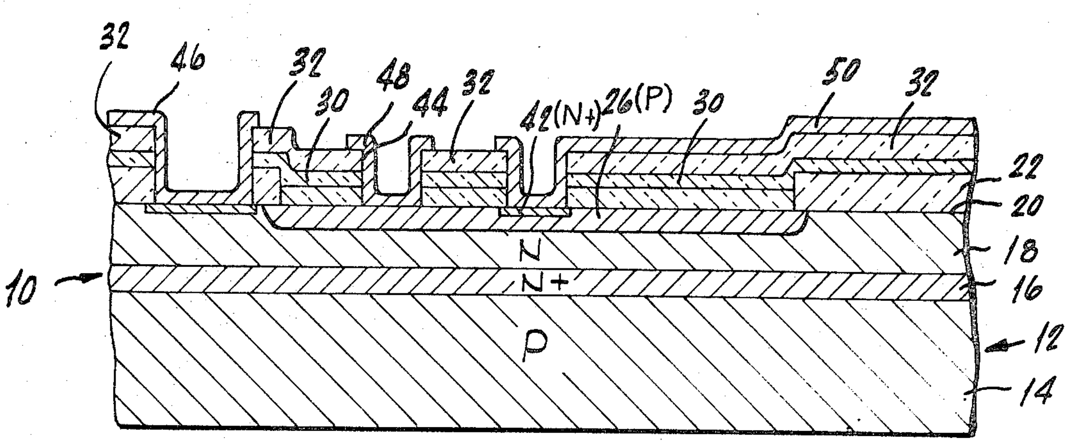

The completed device is illustrated in FIG. 6. The phosphosilicate glass layer 38 formed during the step illustrated in FIG. 5, is removed in conventional fashion and a base contact opening 44 is formed at a desired location adjacent to the base region 26. Contact metallization, illustrated as a collector contact 46, a base contact 48 and an emitter contact 50 are then deposited on the surface in ohmic contact with the various regions, all in known fashion.

The finished device includes a layer of phosphosilicate glass 30 within the passivating oxide over all of the surface 20 except those portions occupied by the contact metallization. The phosphosilicate glass coating 30 is incorporated in the device at a time in the processing such that it remains well protected from the various etching solutions which are applied to the device in the subsequent processing. The device so formed is stable and can be produced repeatedly and reliably because there is no etching of the phosphosilicate glass layer.

What is claimed is:

1. In an improved process for fabricating a phosphosilicate glass passivated transistor in a body of semiconductive material of one type conductivity having a surface, said process including the steps of forming a base region of conductivity type opposite to that of said body in said body adjacent to said surface by diffusion of conductivity modifying impurities in an oxidizing ambient whereby the surface of said body is oxidized to form a diffusion masking coating for a subsequent emitter diffusion, and thereafter forming an emitter region by forming an opening in said diffusion masking coating and introducing conductivity modifying impurities into a portion of said base region through said opening, the improvement comprising the steps of:

after forming said base region and diffusion masking coating but before forming said opening, forming a phosphosilicate glass coating on said diffusion masking coating, and forming a protective coating over said phosphosilicate glass coating.

2. A transistor fabricating process as defined in claim 1 wherein said protective coating forming step is performed by heating said body in an ambient containing silane and oxygen for a time and at a temperature sufficient to produce deposition of a coating of silicone dioxide of predetermined thickness and density on said phosphosilicate glass coating, and further heating said body in an oxygen ambient free of silane for a time and at a temperature sufficient to densify said silicon dioxide coating.

3. A method of making a phosphosilicate glass passivated transistor in a body of semiconductive material of one type conductivity having a surface and a region of conductivity type opposite to that of said body in said adjacent to said surface, comprising the steps of forming a diffusion masking coating on said surface over said region of opposite type conductivity, heating said body in an ambient containing phosphorus and oxygen for a time and at a temperature sufficient to form a phosphosilicate glass coating on the surface of said diffusion masking coating, forming a protective coating over said phosphosilicate glass coating, selectively removing said protective coating, said phosphosilicate glass coating and said diffusion masking coating from a portion of said surface adjacent to said region of opposite type conductivity, and heating said body in an ambient containing a conductivity modifier of said one type to form a diffused region of said one type conductivity within said region of opposite type conductivity.

4. A transistor making method as defined in claim 3 wherein said region of opposite type conductivity in said body and said diffusion masking coating over said region of opposite type conductivity are formed by forming a first masking coating on said body, selectively removing said first masking coating from that portion of said surface where said region of opposite type conductivity is desired, heating said body in an ambient containing a conductivity modifying impurity of said opposite type to form a shallow diffused region of said opposite type conductivity in said body adjacent to said surface, and further heating said body in an oxidizing ambient to cause further diffusion of conductivity modifying impurities into said body and simultaneously to form said diffusion masking coating on said surface, said further heating step being carried out for a time less than that required to form said diffusion masking coating to a predetermined thickness and to redistribute said impurities to a predetermined depth.

5. A transistor making method as defined in claim 4 wherein said step of forming a protective coating over said phosphosilicate glass coating is carried out by pyrolytically depositing a coating of silicon dioxide over said phosphosilicate glass coating, and heating said body in an oxidizing ambient to densify said silicon dioxide coating and simultaneously to increase the thickness of said diffusion masking coating to said predetermined thickness and to redistribute said impurities to said predetermined depth.

6. A method of making a phosphosilicate glass passivated transistor in a body of silicon of N type conductivity having a surface comprising the steps of forming a base region of P type conductivity in said body adjacent to said surface, forming a masking oxide coating on said surface over said base region, forming a coating of phosphosilicate glass on the surface of said masking oxide coating, forming a coating of silicon dioxide on said phosphosilicate glass coating, forming an opening through said silicon dioxide coating, said phosphosilicate glass coating and said masking oxide coating adjacent to a portion of said surface within said base region, and diffusing a donor impurity into said base region through said opening to form an N type emitter region.

7. A transistor making method as defined in claim 6 wherein said step of forming a P type base region and said step of forming a masking oxide coating over said base region are carried out by heating said body in an ambient containing acceptor impurities, to form a shallow diffused P type region in said body adjacent to said surface, and further heating said body in an oxidizing ambient to cause further diffusion of acceptors into said body and simultaneously to form said masking oxide coating on said surface, said further heating step being carried out for a time less than that required to form said masking oxide coating to a predetermined thickness and to redistribute said acceptor impurities to a predetermined depth.

8. A transistor making method as defined in claim 7 wherein said silicon dioxide coating forming step is carried out by heating said body in an ambient containing silane and oxygen for a time and at a temperature sufficient to form said silicon dioxide coating to a predetermined density, and thereafter, heating said body in an oxidizing ambient to increase the density of said silicon dioxide coating and simultaneously to increase the thickness of said masking oxide coating to said predetermined thickness and to redistribute said acceptor impurities to said predetermined depth.

References Cited

UNITED STATES PATENTS 3,507,716 4/1970 Nishida et al. ........ 148—187

L. DEWAYNE RUTLEDGE, Primary Examiner

R. A. LESTER, Assistant Examiner

U.S. Cl. X.R.

29—578; 148—187; 317—235